United States Patent [19]

Farwell et al.

[11] Patent Number: 5,896,259
[45] Date of Patent: Apr. 20, 1999

[54] PREHEATING DEVICE FOR ELECTRONIC CIRCUITS

[75] Inventors: William D. Farwell, Thousand Oaks; Manny Tansavatdi, Rancho Palos Verdes, both of Calif.

[73] Assignee: Raytheon Company, Lexington, Mass.

[21] Appl. No.: 08/906,454

[22] Filed: Aug. 5, 1997

[51] Int. Cl.⁶ .................................................. H05B 1/00
[52] U.S. Cl. .......................... 361/78; 361/103; 219/209
[58] Field of Search .................................. 361/103, 106, 361/78, 86, 87, 79, 93, 101, 18; 323/285–287; 327/512; 219/209, 210, 494, 497, 501, 509, 510, 511, 541–548; 307/125, 126, 131, 116

[56] References Cited

U.S. PATENT DOCUMENTS

| | | | |
|---|---|---|---|
| 3,662,150 | 5/1972 | Hartung | 219/209 |
| 4,374,316 | 2/1983 | Inamori et al. | 219/209 |
| 5,010,233 | 4/1991 | Henschen et al. | 219/209 |
| 5,369,245 | 11/1994 | Pickering | 219/209 |
| 5,521,357 | 5/1996 | Lock et al. | 219/543 |
| 5,539,186 | 7/1996 | Abrami et al. | 219/548 |

*Primary Examiner*—Jeffrey Gaffin
*Assistant Examiner*—Michael J. Sherry
*Attorney, Agent, or Firm*—Leonard A. Alkov; Glenn H. Lenzen, Jr.

[57] ABSTRACT

A system for preheating electronic components on a printed wiring board or other interconnecting substrate prior to application of voltage to the components in extreme cold temperature environments. Copper traces are employed as embedded heater elements. A control circuit disables operation of an on-board DC/DC switching converter used to provide power to the electronic components until the board has reached a threshold temperature during a preheating period. Thereafter, the heater operation is synchronized with the operation of the switching converter, such that the temperature can be maintained, yet total power supply current to the board never exceeds a predetermined maximum level.

15 Claims, 4 Drawing Sheets

PREHEATING DEVICE FOR ELECTRONIC CIRCUITS

TECHNICAL FIELD OF THE INVENTION

This invention relates to electronic components on printed wiring boards or other multi-layer, interconnecting substrates on which electronic components are mounted, and more particularly to techniques for preheating the electronic components prior to application of voltage to the components.

BACKGROUND OF THE INVENTION

Extreme cold temperature environments create problems for the use of electronic devices mounted on printed wiring boards (PWBs) or other multilayer interconnecting substrates, since devices may not have been designed to operate at the temperatures encountered (e.g., the minimum design temperature is higher). One exemplary application having exposure to such extreme environments is avionics circuitry. The risks posed to electronic devices operating in extreme cold weather environments include long and unpredictable warm-up time from turn-on until a system is functional, the possibility of failure to properly initialize (e.g., never reaching a point of functioning), and the risk of permanent damage to devices.

To address the risks posed by extreme cold environments, manufacturers and circuit designers have typically resorted to three approaches. The first is to restrict the use of devices to those which have been explicitly designed for the low temperatures to be experienced. This undesirably limits the available devices which could be used in the system.

A second approach is to screen devices which have not been designed for extreme cold temperatures. This entails testing individual devices at cold temperature, and rejecting those which fail to meet all functional and parametric requirements. Screening IC devices for cold temperature operation may typically increase cost by three to five times. Also, there is an ongoing risk that future production devices will fail screening and thus be unavailable for use, since there is no assurance by design that the parts work cold. Thus, the ability to use unscreened ICs in extreme temperature environments would be advantageous.

A third approach is to use unscreened electronic components, and to power-up the devices and rely on their power dissipation to warm-up the circuit until it is functional. The disadvantages are that the necessary warm-up time is long (since forcing all devices to dissipate maximum power during this period is difficult or impossible), and the warm up time is unknown, since power dissipation is unknown, because the parts may not be properly functioning. Finally, there is risk of unforseen failure during warm-up, such as failure to initialize, or actual circuit damage.

It would therefore be an advance in the art to provide a technique for preheating the electronic devices on PWBs or other interconnecting substrates prior to application of power to these electronic devices.

SUMMARY OF THE INVENTION

A circuit for preheating electronic components on an interconnecting multilayer substrate, such as a PWB, prior to application of supply voltage to the electronic components is described. In accordance with one aspect of the invention, an array of connected thin conductive trace portions is formed on a dielectric surface of the interconnecting substrate, the array distributed over a substantial portion of area of the interconnecting substrate. The trace portions are formed of a conductive material such that the thinness of the trace portions provides a small cross-sectional area having usable resistive values for a resistive heater element. Another aspect of the invention is that the conductive material be the same material as that being used for the other conductive layers of the interconnecting substrate, so that the fabrication technique for this resistive array is identical to that used on the other conductive layers of the substrate. Control circuitry is provided for applying a voltage between first and second end terminals of the array to cause resistive heating to heat the substrate. In an exemplary embodiment, the conductive material is copper.

In accordance with another aspect of the invention, the interconnecting substrate includes an on-board DC/DC converter for conversion of a external supply voltage to a substrate supply voltage at a level used by the electronic circuits, and control circuitry for disabling operation of the converter during a warmup period, during which time the resistive heater is turned on.

In accordance with a further aspect of the invention, the control circuitry includes synchronizing circuitry for synchronizing operation of the resistive heater and the converter after the initial warmup period such that a minimum temperature is maintained, even if the power dissipated by active circuitry alone would not be sufficient to maintain that temperature, and such that total power supply current to the interconnecting substrate does not exceed a predetermined maximum current level.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

This invention provides a technique to preheat electronic components on an interconnecting substrate, such as a printed wiring board (PWB), prior to application of voltage to those components. The purpose is to enable use of electronic devices in extreme cold temperature environments in which temperature is less than the minimum temperature for which the electronic devices had been designed or specified. The invention has three aspects: 1) Use of conductive substrate traces, such as copper PWB traces, as resistive heaters. 2) Adaptation of pre-existing, on-board DC/DC converters to disable the application of power to the substrate mounted active electronic components such as ICs during the preheating period. 3) Synchronization of heater with the switching DC/DC converter (after initial warm-up) such that temperature can be maintained, yet total power supply current to the board never exceeds specification.

The invention assures that electronic devices are at their minimum design temperature after a warm-up period, and that they remain at or above that temperature during subsequent operation.

A deterministic warm-up time is assured, since power dissipated during warm-up can be explicitly specified. (Accurate prediction of power dissipated by ICs is difficult, even if they are properly operating, and during warm-up unscreened IC's cannot be assumed to properly operate).

Figure 4:
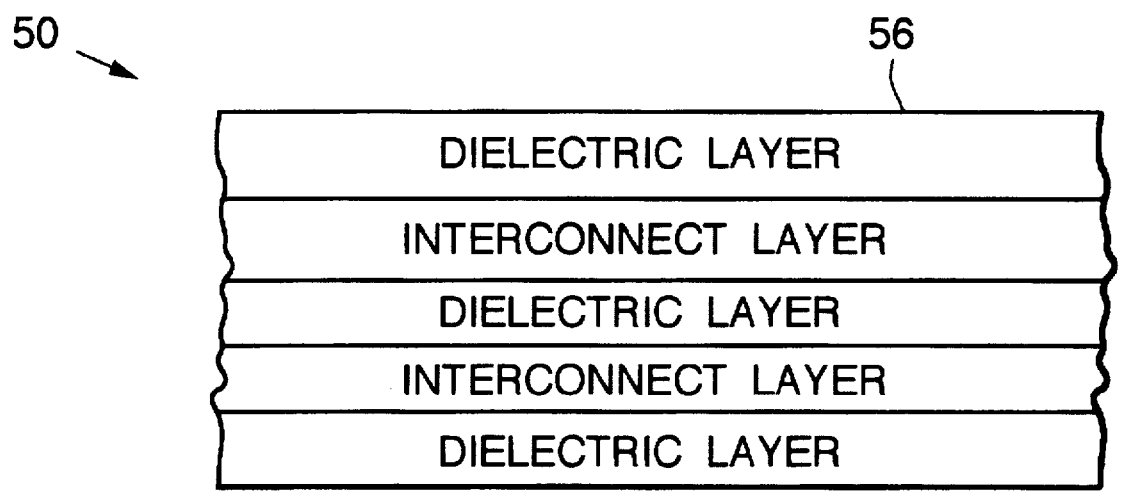
FIG. 4 is a simplified diagrammatic side view of a printed wiring board.

The invention can easily and inexpensively be implemented by using conductive material for the heating element which is the same as otherwise used in the substrate. For example, use of copper as a heating element permits fabrication with standard multi-layer PWB processes and simply adds one layer to the multi-layer stack. PWBs are typically a sandwich of multiple conductive interconnect layers separated by epoxy/fiberglass dielectric layers, as generally shown in the diagrammatic side view of FIG. 4. The various conductive layers are selectively connected using through-hole vias. Using existing DC/DC converters for power switching is "free" and means there is no disturbance of power distribution characteristics.

Although the conductivity of copper makes it an unusual candidate for a resistive heating element, copper PWB traces with small cross-sectional area have usable resistance values; e.g., 10 mil traces of 1.4 mil thick copper exhibit around 0.05 ohm per inch. These dimensions are typical of signal traces used on PWBs. For an exemplary trace length of 100 inches, this is 5 ohms and dissipates 5 watts (50 mwatt per inch) at 5 volts. Other kinds of interconnecting substrates typically use aluminum (deposited on thin film dielectrics) or tungsten and gold (used with ceramic substrates). For these alternate substrates, the heater array traces would be fabricated of the same conductive material using the same fabrication techniques.

Figure 1:
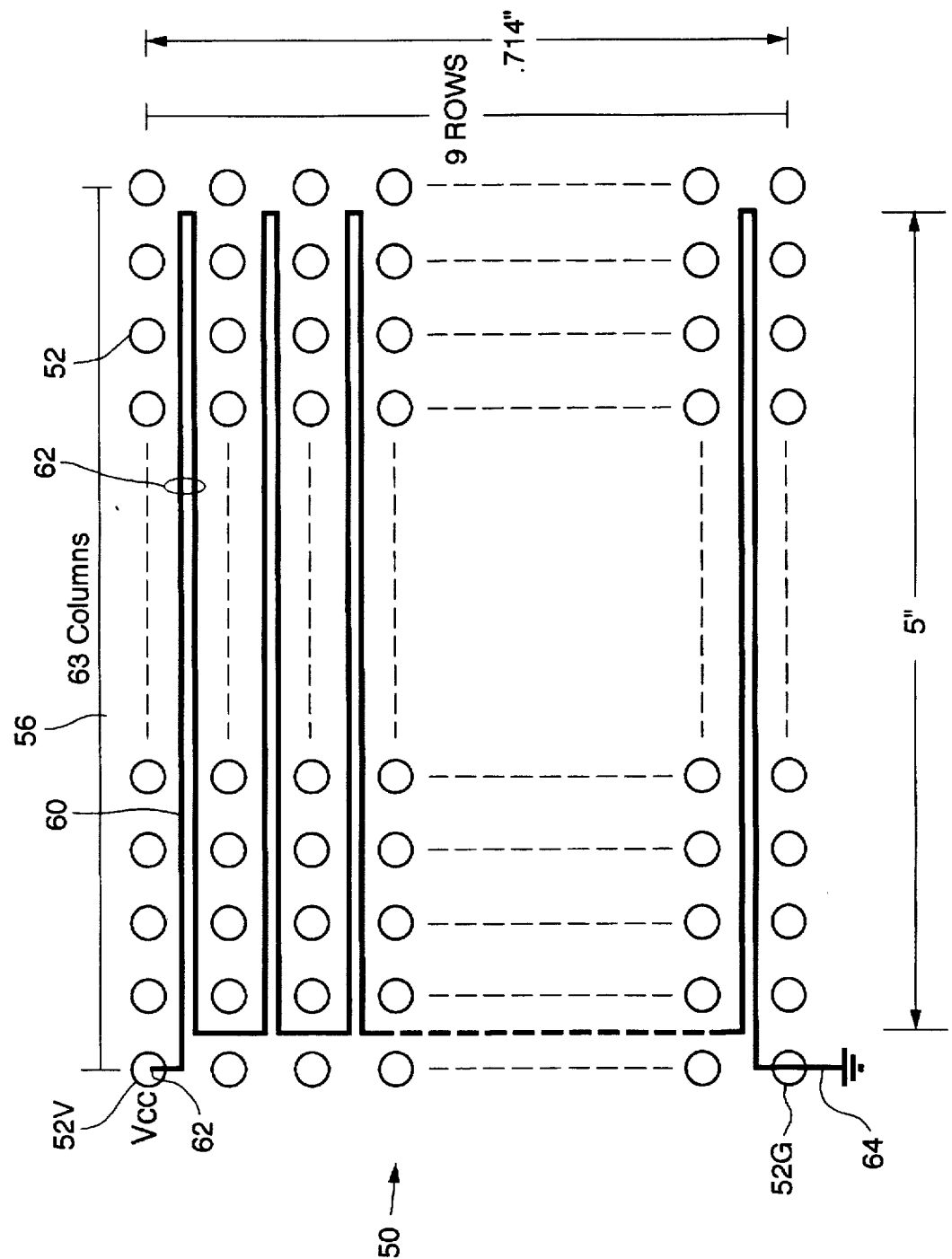
FIG. 1 is a top view of a multi-layer printed wiring board, illustrating a heating element in accordance with the invention.

An exemplary array of heater traces is shown in FIG. 1. FIG. 1 is a top diagrammatic view of a section of the top layer of a single multi-layer PWB 50, having 63 columns and 9 rows of conductive vias 52 used to interconnect wiring traces in the various layers of the multi-layer PWB in the conventional manner. An exemplary size of the PWB 50 is 5 inches by 5 inches which includes seven of these sections. In accordance with the invention, the top dielectric layer 56 of the PWB has formed thereon a continuous copper trace 60, 10 mils in width, and 1.4 mils in thickness, which runs back and forward between the rows of vias, to provide the necessary length of a copper pattern to provide the desired ohmic loss. One end 62 of the heater trace is connected to a via 52V, which is connected to a powering voltage, say 5 volts. The second end 64 of the trace is connected to a ground via 52G and to the return of the powering voltage.

While the trace 60 is illustrated in FIG. 1 as fabricated on a top surface of the PWB, the trace could alternatively be buried within the multi-layer PWB, i.e. disposed on a layer which is not the top surface.

For the 5 inch by 5 inch PWB 50, within 9 rows of vias, 8 round trip portions, each about 10 inches in length, of the trace can readily be provided between the upper and lower rows of vias. For example the first round trip portion is designated by reference 62 in FIG. 1. This provides a trace length of about 80 inches. This has 4 ohms resistance, and when powered with 5 volts, dissipates 6.25 watts. Thus, on a 5 inch by 5 inch PWB having seven such sections, a single PWB layer can dissipate at least 43.75 watts.

Figure 2:
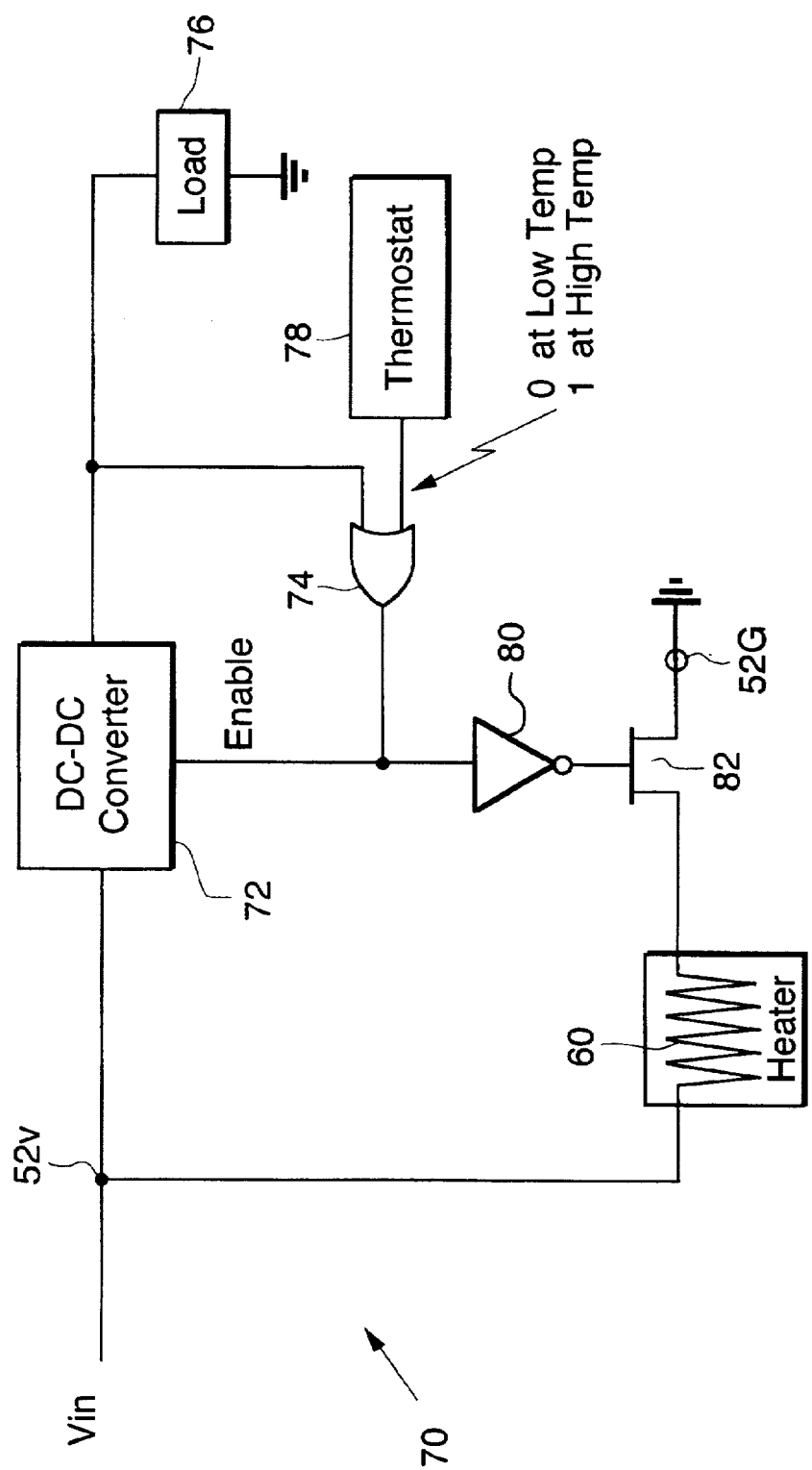
FIG. 2 shows a typical control for a heater circuit embodying the invention, employing a pre-existing DC/DC converter and a thermostat IC, which will provide for warm-up.

FIG. 2 illustrates the operation of a controller circuit 70 which provides for warm-up prior to active circuit operation. The controller circuit includes the existing DC—DC converter 72 which is a component of the substrate-mounted electronic circuitry. The converter 72 converts the $V_{in}$ supply voltage, e.g. 5 volts, at node 52V into a different voltage level, e.g. 3.3 volts used to power the electronic circuits populating the PWB 50. These electronic circuits are designated generally as load 76. The converter 72 is conventional in design and operation. The output of the converter 72 is connected to one input of an OR gate 74; the other OR gate input is provided by the output of a thermostat device 78. This device provides a logical output signal at logical 0 when the sensed temperature is below a threshold, and at logical one when the sensed temperature is above the threshold. The OR gate output is connected to the ENABLE signal terminal of the converter 72, and through invertor 80 to the gate of transistor switch 82. The resistor trace 60 is connected between vias 52V and the ground via 52G.

At cold start-up, the thermostat 78 output is logical 0, and the DC/DC converter 72 voltage output is 0. Thus the OR gate 74 output is logical 0 and the DC/DC converter is disabled, and the transistor switch 82 is ON, powering the heating element 60.

When the thermostat 78 reaches threshold temperature, its logical output transitions to logical 1, forcing the OR gate 74 output to logical 1. This turns off the heater and enables the DC/DC converter. As soon as the DC/DC converter 72 reaches a 3.3 v output, its input to the OR gate becomes a logical 1, so the output of the OR gate latches permanently to 1, independent of the thermostat. This assures the DC/DC converter to be permanently turned ON after warm-up is achieved, and the heater permanently turned off. This simple circuit is sufficient for systems needing warm-up only.

Figure 3:
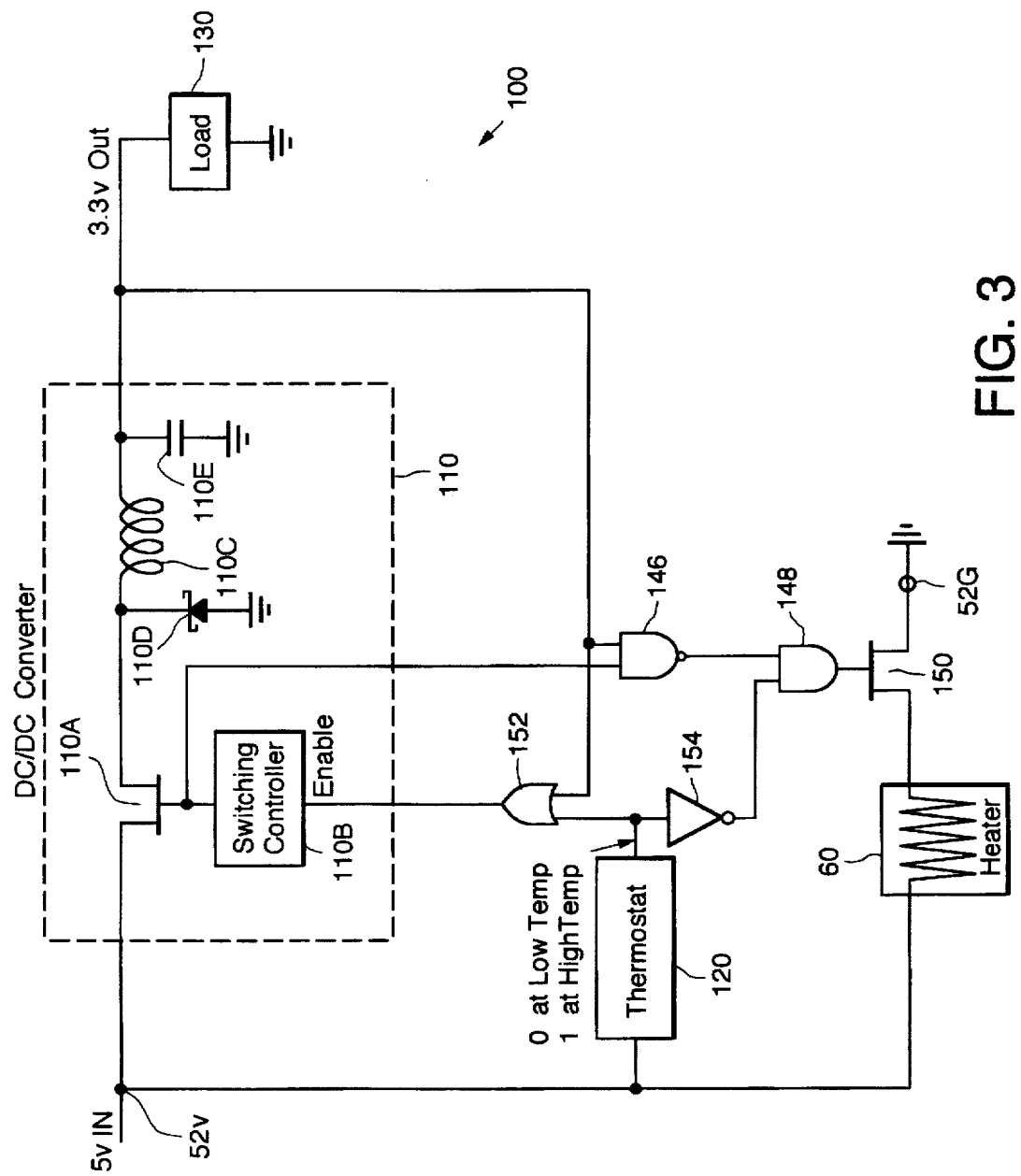
FIG. 3 shows a control for a heater circuit which provides for warm-up, and additionally provides for auxiliary heating, when necessary during normal active circuit operation, in cases when active circuit operation dissipates insufficient power.

FIG. 3 shows a controller providing warm-up, and additionally, auxiliary heating as necessary during subsequent operation. It employs a pre-existing DC/DC converter 110 on the PWB 50, and a thermostat IC 120. The converter 110 converts the 5 volt supply voltage at via 52V into a 3.3 voltage level used to power the electronic circuits populating the PWB 50. These electronic circuits are designated generally as load 130. The converter 110 is conventional in design and operation, and includes a gating transistor switch 110A controlled by switching controller 110B to selectively connect the 5 volt supply voltage to the Schottky diode 110D and the smoothing filter provided by the inductor 110C and capacitor 110E, which converts the 5 volt supply voltage to a 3.3 volt level. The base of the transistor 110A is connected to the switching controller 110B and to one input of logical NAND gate 146; the other input of the gate is connected to the output of the converter circuit 110. The output of gate 146 is in turn connected as one input to logical AND gate 148. The other input to the AND gate is connected to the output of inverter 154, which is connected to the output of thermostat 120. The thermostat 120 provides an output which is at logical 0 when the temperature sensed by the thermostat is low, i.e. below the threshold temperature, and at logical one when the sensed temperature is at or above the threshold temperature. The thermostat output also is connected to logical OR gate 152; the other input to this OR gate is connected to the output of the converter circuit 110.

The output of the OR gate 152 is connected to the ENABLE input of the switching converter 110. If the gate output is logical one, the converter is switched on; if the output of gate 152 is 0, the converter is switched off.

The output of AND gate 148 drives the base of transistor switch 150, which selectively provides a connection to ground. If switch 150 is closed, current flows through the heater trace 60, and the heater is turned on. If the switch 150 is open, no current flows through the heater, which is turned off.

The circuit of FIG. 3 operates in the following manner. At cold start, the heater is turned on, and the switching converter is turned off. This results from logical 0 output from the thermostat, which provides a logical 0 output from OR gate 152, so that the converter circuit 110 is turned off, and which when inverted by inverter 154 provides a logical one to AND gate 148, turning on switch transistor 150. Once the PWB reaches a threshold temperature, as determined by the thermostat 120, the converter latches on. The transistor 110A is periodically pulsed ON and off. These pulses are integrated by inductor 110C to provide a continuous 3.3 volts to the load. A higher current requirement results in a longer ON time. This is a conventional DC/DC switching converter. When the thermostat first switches to logical 1, the output of OR gate 152 goes to logical 1, enabling the DC—DC converter. The output goes to 3.3 v, which is a logical 1 at the other input of OR gate 152. Thereafter, the output of 152 is latched permanently at logical 1, and the DC—DC converter is permanently ON, independent of the state of the thermostat. Thereafter, the heater is turned on by the thermostat 120 as needed to maintain the PWB at a desired temperature, but only at times when the converter switching transistor 110A is off by operation of controller 110B. As a result, the supplied current to the PWB never exceeds a specified maximum current level.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A circuit for preheating electronic components on an interconnecting multi-layer printed wiring board (PWB), prior to application of supply voltage to the electronic components, comprising:

an array of connected thin conductive trace portions formed on a dielectric surface of said interconnecting PWB, said array distributed over a substantial portion of area of said PWB, said trace portions running between a first set of conductive vias extending between said dielectric surface and buried layers of said PWB, wherein said trace portions do not make electrical contact with said first set of vias, said trace portions formed of a conductive material such that the thinness of said trace portions provides a small cross-sectional area having usable resistive values for a resistive heater element; and control circuitry for applying a voltage between first and second end terminals of said array to cause resistive heating to heat said PWB.

2. The circuit of claim 1 wherein said conductive material is the same as used for other signal and power conductors fabricated in the PWB.

3. The circuit of claim 1 wherein said first array end terminal is connected to a via connected to a powering voltage and wherein said second array end terminal is connected to a via connected to the return for said powering voltage.

4. A multi-layer interconnecting substrate having an on-board heater for use in cold temperature environments, comprising:

a multi-layer interconnecting substrate, said substrate including a plurality of electronic components disposed on one or more layers of said substrate;

an on-board DC/DC voltage converter for converting a powering voltage to a substrate supply voltage level suitable for powering said electronic components;

an array of connected thin conductive trace portions formed on a dielectric layer of said substrate, said array distributed over a substantial portion of area of said substrate, said trace portions formed of a conductive material such that the thinness of said trace portions provides a small cross-sectional area having usable resistive values for a resistive heater element; and control circuitry for applying a voltage between first and second end terminals of said array to cause resistive heating to heat said substrate, said control circuitry further including converter disabling circuitry for disabling operation of converter during a warmup period.

5. The substrate of claim 4 wherein said conductive material is the same as used for signal and power conductors fabricated in the substrate.

6. The substrate of claim 4, wherein said interconnecting substrate is a multi-layer printed wiring board.

7. The substrate of claim 4 wherein said converter includes a converter switch element, an inductor/capacitor circuit, and a switching controller for switching the converter switch element on and off to develop said powering voltage, said circuitry for disconnecting said trace array from said powering voltage when the temperature is above the threshold value including a trace array switch element, and wherein said synchronizing circuitry is adapted to prevent said converter switch element and said trace array switch element from simultaneously being switched on.

8. The substrate of claim 4 wherein said control circuitry includes a thermostat circuit for generating a logical threshold signal which changes states when the thermostat reaches a threshold temperature, said threshold signal state change indicating expiration of said warmup period, said control circuitry further including a switch element responsive to the threshold signal state change to disconnect said voltage from said terminals, and said converter disabling circuitry further includes latching circuitry responsive to the threshold signal state change for enabling operation of said converter.

9. The substrate of claim 4 wherein said control circuitry includes a thermostat for sensing a temperature of said substrate and providing a logical output signal having a first state when the temperature is below a threshold value and a second state when the temperature is above the threshold value.

10. The substrate of claim 9, wherein said control circuitry further includes apparatus for disabling application of said powering voltage to said trace array when the temperature is above the threshold value, and synchronizing circuitry for synchronizing operation of said disabling apparatus and said converter after an initial warmup period such that total power supply current to the substrate does not exceed a predetermined maximum current level.

11. A circuit for preheating electronic components on an interconnecting substrate, prior to application of supply voltage to the electronic components, comprising:

an array of connected thin conductive trace portions formed on a dielectric surface of said interconnecting substrate, said array distributed over a substantial portion of area of said substrate, said trace portions running between a first set of conductive vias extending between said dielectric surface and buried layers of said substrate, wherein said trace portions do not make electrical contact with said first set of vias, said trace portions formed of a conductive material such that the thinness of said trace portions provides a small cross-sectional area having usable resistive values for a resistive heater element;

an on-board DC/DC converter for conversion of a powering voltage to a substrate supply voltage at a level used by said electronic components; and control circuitry for applying a voltage between first and second end terminals of said array to cause resistive heating to heat said substrate, said control circuitry further including converter disabling circuitry for disabling operation of said converter during a warmup period.

12. The circuit of claim 11 wherein said control circuitry includes a thermostat circuit for generating a logical threshold signal which changes states when the thermostat reaches a threshold temperature, said threshold signal state change indicating expiration of said warmup period, said control circuitry further including a switch element responsive to the threshold signal state change to disconnect said voltage from said terminals, and said converter disabling circuitry further includes latching circuitry responsive to the threshold signal state change for enabling operation of said converter.

13. The circuit of claim 11 wherein said control circuitry includes a thermostat for sensing a temperature of said substrate and providing a logical output signal having a first state when the temperature is below a threshold value and a second state when the temperature is above the threshold value.

14. The circuit of claim 13 wherein said control circuitry further includes circuitry for disconnecting said trace array from said powering voltage when the temperature is above the threshold value, and synchronizing circuitry for synchronizing operation of said disconnecting apparatus and said converter after an initial warmup period such that total power supply current to the interconnecting substrate does not exceed a predetermined maximum current level.

15. The circuit of claim 14 wherein said converter includes a converter switch element, an inductor/capacitor circuit, and a switching controller for switching the converter switch element on and off to develop said powering voltage, said circuitry for disconnecting said trace array from said powering voltage when the temperature is above the threshold value including a trace array switch element, and wherein said synchronizing circuitry is adapted to prevent said converter switch element and said trace array switch element from simultaneously being switched on.

* * * * *